United States Patent
Kawasaki et al.

(10) Patent No.: US 11,883,926 B2
(45) Date of Patent: Jan. 30, 2024

(54) POLISHING PAD, SEMICONDUCTOR FABRICATING DEVICE AND FABRICATING METHOD OF SEMICONDUCTOR DEVICE

(71) Applicant: Kioxia Corporation, Tokyo (JP)

(72) Inventors: Takahiko Kawasaki, Nagoya Aichi (JP); Yukiteru Matsui, Nagoya Aichi (JP); Akifumi Gawase, Kuwana Mie (JP)

(73) Assignee: KIOXIA CORPORATION, Tokyo (JP)

( * ) Notice: Subject to any disclaimer, the term of this patent is extended or adjusted under 35 U.S.C. 154(b) by 1 day.

(21) Appl. No.: 17/319,637

(22) Filed: May 13, 2021

(65) Prior Publication Data

US 2021/0260719 A1    Aug. 26, 2021

Related U.S. Application Data

(62) Division of application No. 16/109,665, filed on Aug. 22, 2018, now abandoned.

(30) Foreign Application Priority Data

Mar. 13, 2018 (JP) .................................. 2018-045394

(51) Int. Cl.
- *B24B 37/26* (2012.01)
- *B24B 37/24* (2012.01)
- *B24B 53/017* (2012.01)
- *H01L 21/768* (2006.01)
- *H01L 21/321* (2006.01)
- *H01L 21/3105* (2006.01)
- *H01L 23/532* (2006.01)

(52) U.S. Cl.
CPC .............. *B24B 37/26* (2013.01); *B24B 37/24* (2013.01); *B24B 53/017* (2013.01); *H01L 21/31055* (2013.01); *H01L 21/3212* (2013.01); *H01L 21/7684* (2013.01); *H01L 21/76805* (2013.01); *H01L 21/76819* (2013.01); *H01L 21/76895* (2013.01); *H01L 23/53257* (2013.01)

(58) Field of Classification Search
None
See application file for complete search history.

(56) References Cited

U.S. PATENT DOCUMENTS

| | | | |
|---|---|---|---|
| 5,876,265 A * | 3/1999 | Kojima | B24B 37/042 438/692 |
| 7,357,703 B2 * | 4/2008 | Nishimura | B24B 37/30 451/526 |
| 8,075,372 B2 | 12/2011 | Prasad | |

(Continued)

FOREIGN PATENT DOCUMENTS

| | | | | |
|---|---|---|---|---|
| CN | 1671509 A * | 9/2005 | ............ | B24B 37/24 |
| JP | H09-123057 A | 5/1997 | | |

(Continued)

*Primary Examiner* — Sylvia MacArthur
(74) *Attorney, Agent, or Firm* — Foley & Lardner LLP

(57) ABSTRACT

A polishing pad is described. The polishing pad includes a surface having plural recess portions, and a substrate is polished by the surface. In the pad, an average width of the recess portions at one area of the surface in a direction parallel to the surface is 20 μm or less, and an average density of the recess portions at one area of the surface is 1,300/mm² or more.

16 Claims, 9 Drawing Sheets

(56) References Cited

U.S. PATENT DOCUMENTS

| | | | |
|---|---|---|---|
| 8,162,728 B2 | 4/2012 | James et al. | |
| 8,388,799 B2 | 3/2013 | Kuwabara et al. | |
| 8,668,553 B2 | 3/2014 | Korogi | |
| 9,149,905 B2* | 10/2015 | Itoyama | B24B 37/24 |
| 9,539,694 B1 | 1/2017 | Kozhukh et al. | |
| 9,849,558 B2 | 12/2017 | Nakayama et al. | |
| 2004/0053007 A1 | 3/2004 | Huh et al. | |
| 2007/0284338 A1 | 12/2007 | Matsui et al. | |
| 2010/0279435 A1 | 11/2010 | Xu et al. | |
| 2011/0159782 A1 | 6/2011 | Sone et al. | |
| 2012/0220195 A1* | 8/2012 | Gawase | B24B 37/24 451/7 |
| 2013/0045596 A1* | 2/2013 | Eda | B24B 37/042 438/692 |
| 2013/0331004 A1* | 12/2013 | Minamihaba | B24B 37/26 451/53 |
| 2013/0331005 A1* | 12/2013 | Gawase | B24B 53/095 451/56 |
| 2015/0004878 A1 | 1/2015 | Matsui et al. | |
| 2015/0056895 A1 | 2/2015 | Fotou et al. | |
| 2017/0259399 A1 | 9/2017 | Watanabe et al. | |
| 2019/0283206 A1* | 9/2019 | Kawasaki | B24B 37/24 |
| 2021/0260719 A1* | 8/2021 | Kawasaki | B24B 37/26 |

FOREIGN PATENT DOCUMENTS

| | | |
|---|---|---|
| JP | 2004-119974 | 4/2004 |
| JP | 2006-142438 | 6/2006 |
| JP | 2006-237445 A | 9/2006 |
| JP | 2009-266984 A | 11/2009 |
| JP | 2011-136406 | 7/2011 |
| JP | 2013-022664 A | 2/2013 |
| JP | 2015-157334 A | 9/2015 |
| JP | 2016-153152 A | 8/2016 |
| JP | 2016-528054 | 9/2016 |
| JP | 2017-162928 A | 9/2017 |

* cited by examiner

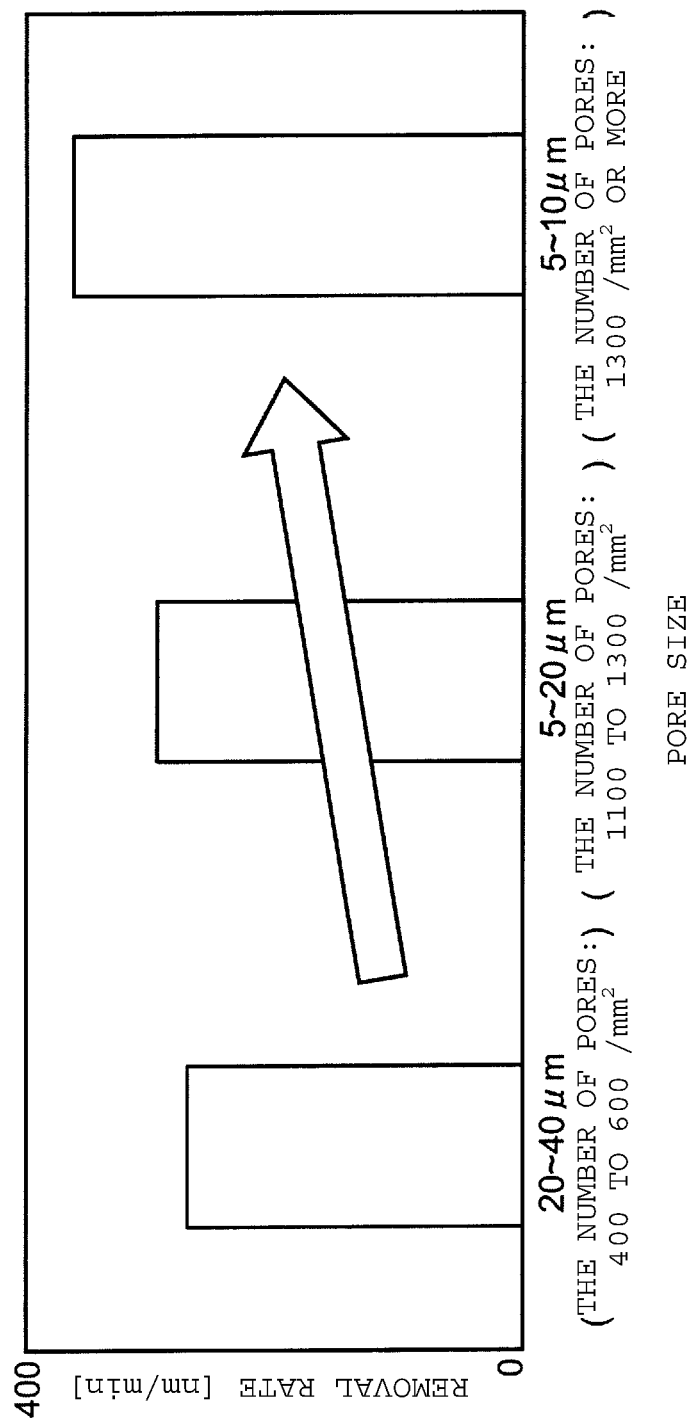

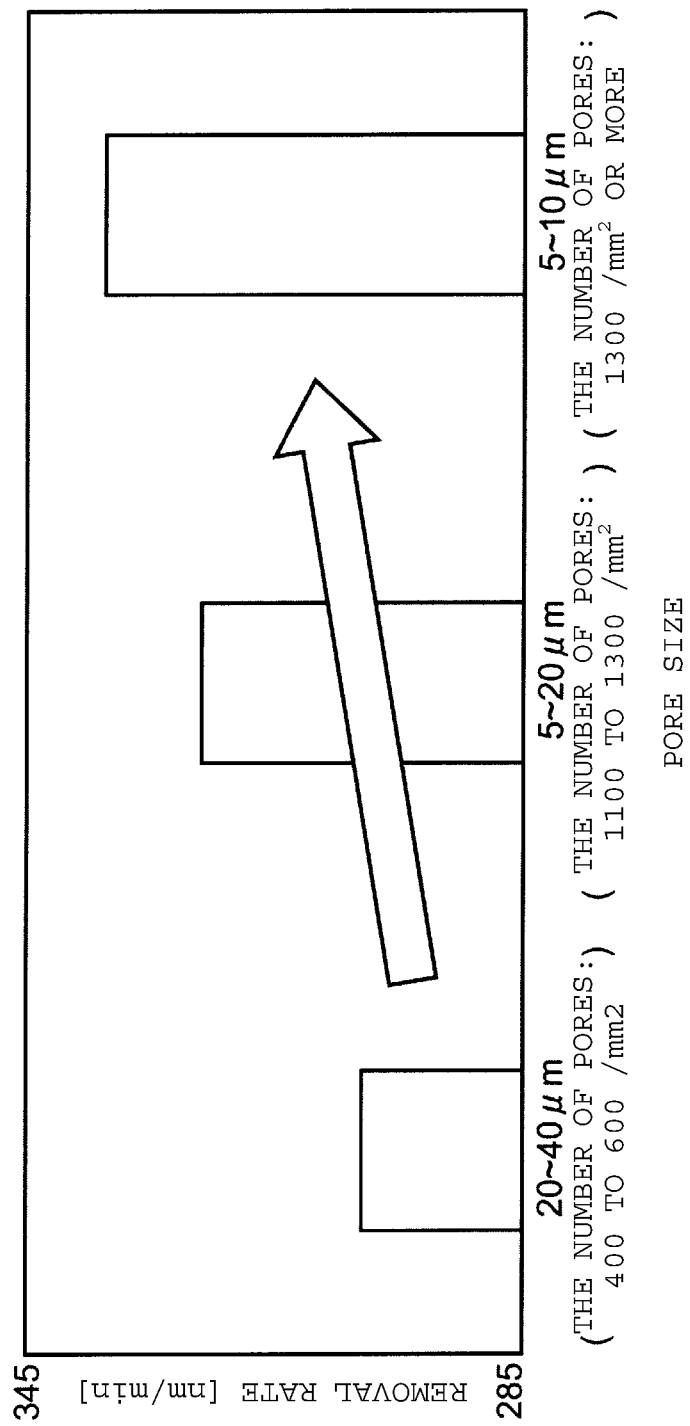

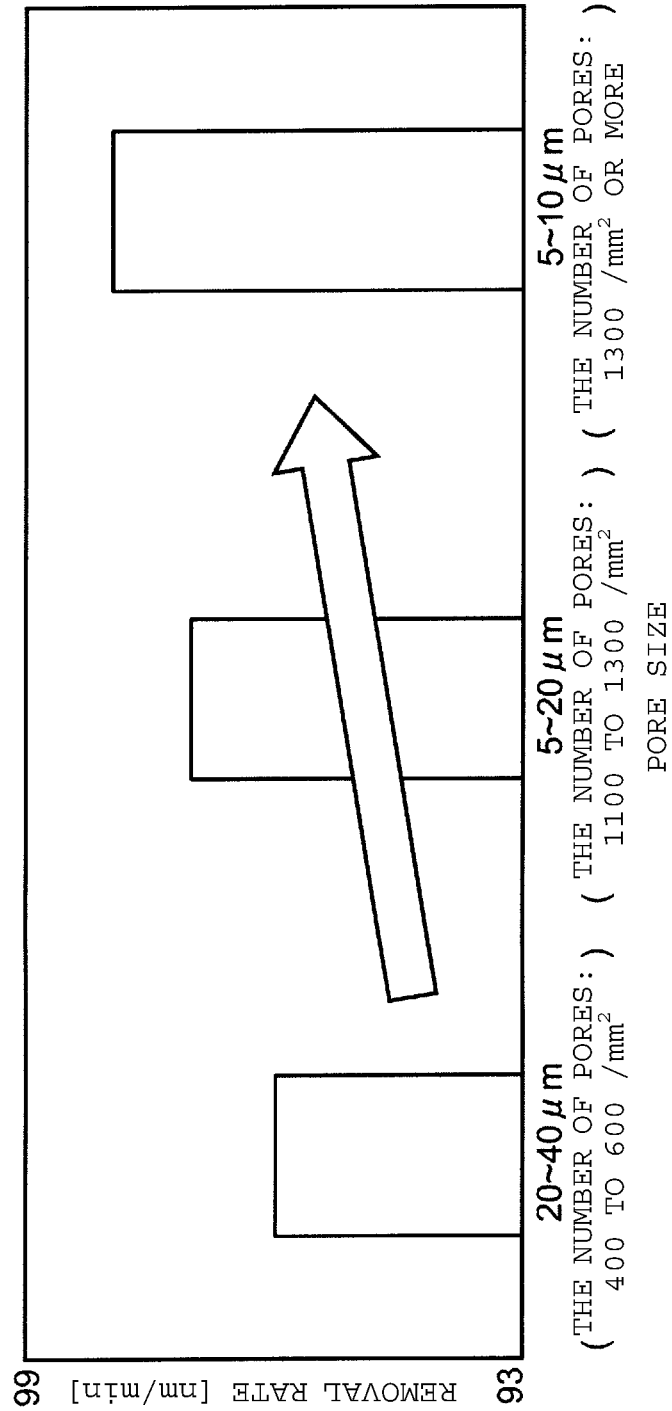

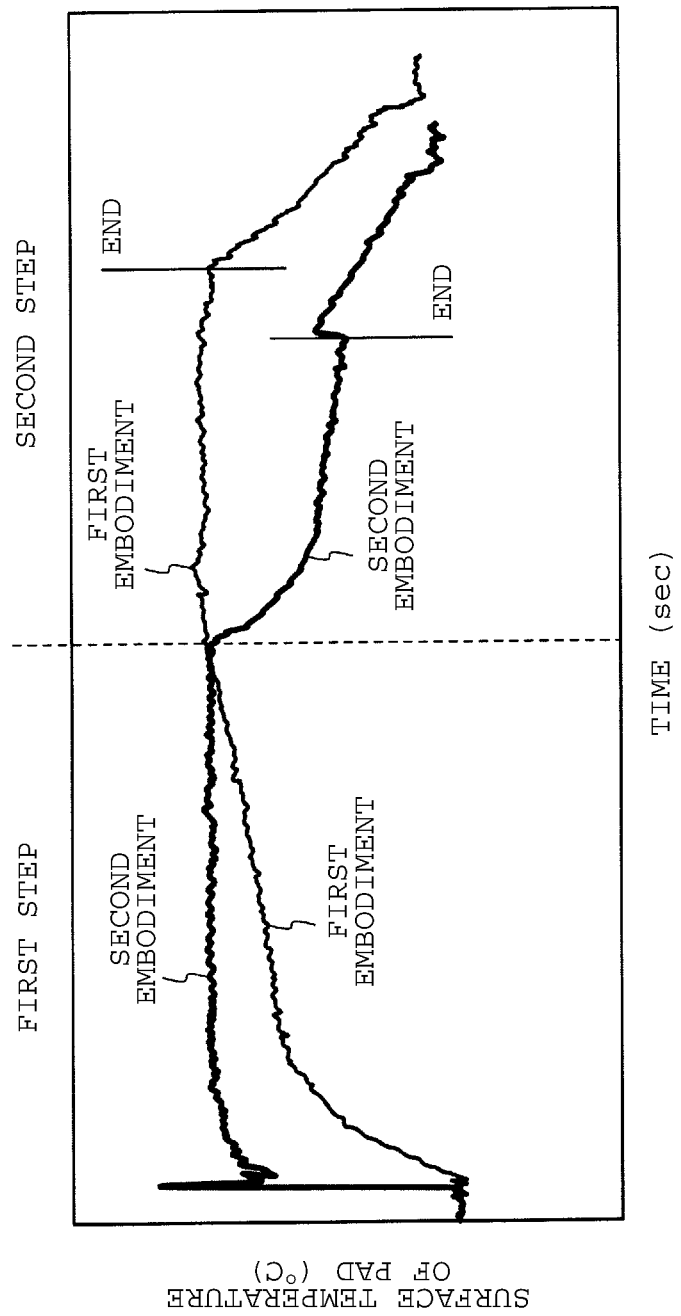

<50%>

<65%>

POLISHING PAD, SEMICONDUCTOR FABRICATING DEVICE AND FABRICATING METHOD OF SEMICONDUCTOR DEVICE

CROSS-REFERENCE TO RELATED APPLICATIONS

This application is a Divisional of U.S. application Ser. No. 16/109,665, filed Aug. 22, 2018, which claims priority from Japanese Patent Application No. 2018-045394, filed Mar. 13, 2018, the entire contents of which are incorporated herein by reference.

FIELD

Embodiments described herein relate generally to a polishing pad, a semiconductor fabricating device, and a fabricating method of a semiconductor device.

BACKGROUND

In the related art, in a fabricating process of a semiconductor device, a frequency of a Chemical Mechanical Polishing (CMP) process of polishing a substrate is increased since a three-dimensional structure such as a three-dimensional memory is processed in many cases. For this reason, a method is required which performs the CMP process efficiently.

DESCRIPTION OF THE DRAWINGS

FIG. 3 is a graph (1/3) for explaining a performance of the polishing pad of the first embodiment;

FIG. 4 is a graph (2/3) for explaining a performance of the polishing pad of the first embodiment;

FIG. 5 is a graph (3/3) for explaining a performance of the polishing pad of the first embodiment;

FIG. 8 is a graph (1/2) in which the performance of the polishing pad is compared between the first and second embodiments;

DETAILED DESCRIPTION

Figure 1:
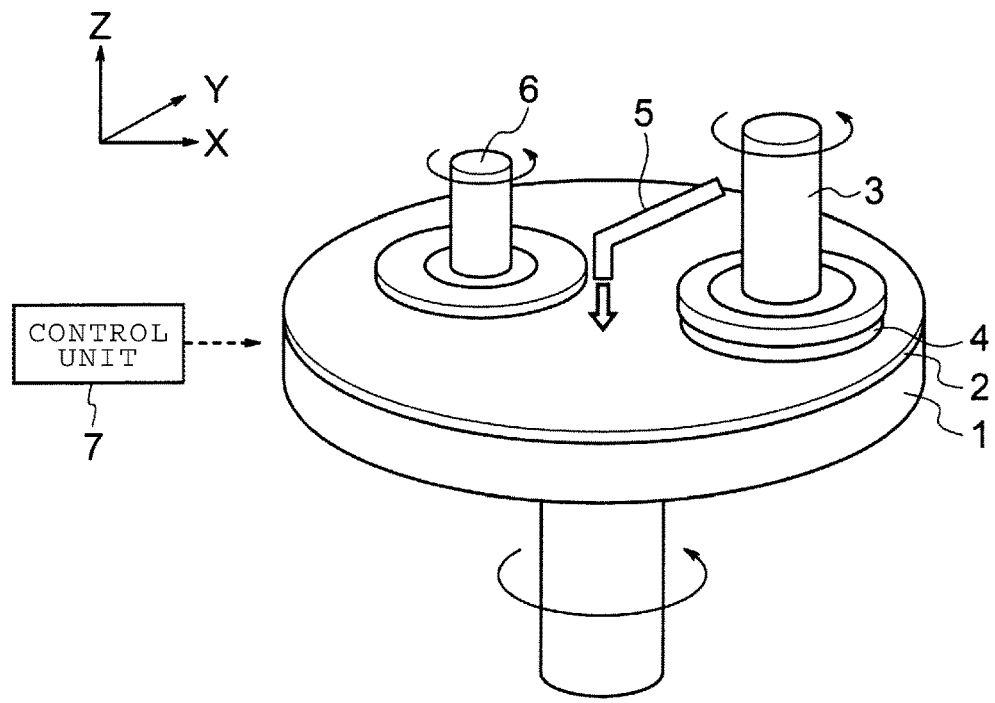
FIG. 1 is a perspective view illustrating a structure of a semiconductor fabricating device of a first embodiment.

At least some embodiments provide a polishing pad, a semiconductor fabricating device, and a fabricating method of a semiconductor device in which a substrate can be polished efficiently.

In general, according to at least one embodiment, a polishing pad includes a surface having plural recess portions, and a substrate is polished by the surface. In the pad, an average width of the recess portions at one area of the surface in a direction parallel to the surface is 20 μm or less, and an average density of the recess portions at one area of the surface is 1,300/mm$^2$ or more.

Hereinafter, embodiments of the present disclosure will be described with reference to the drawings. In FIGS. 1 to 11C, the same or similar components are denoted by the same reference numerals, and the redundant explanation is not repeated.

First Embodiment

FIG. 1 is a perspective view illustrating a structure of a semiconductor fabricating device of a first embodiment.

The semiconductor fabricating device of FIG. 1 includes a polishing table 1 holding a polishing pad 2, a polishing head 3 holding a wafer 4, a slurry supplying unit 5 supplying a slurry, a dresser 6, and a control unit 7. The wafer 4 is one example of the substrate, and the slurry is one example of a polishing liquid. The semiconductor fabricating device of FIG. 1 is a CMP device in which the wafer 4 is polished by the polishing pad 2 to which the slurry is suppled.

FIG. 1 illustrates an X-direction and a Y-direction which are parallel to the upper surface of the polishing pad 2 and perpendicular to each other, and a Z-direction which is perpendicular to the upper surface of the polishing pad 2. In this specification, a '+Z'-direction is set as an upper direction, and a '−Z'-direction is set as a lower direction. However, a '−Z'-direction may match with a gravity direction or may not match with the gravity direction.

As illustrated in FIG. 1, the polishing table 1 rotates the polishing pad 2, the polishing head 3 rotates the wafer 4, and the slurry supplying unit 5 supplies the slurry to the upper surface of the polishing pad 2. Further, the semiconductor fabricating device makes the lower surface of the wafer 4 contact with the upper surface of the polishing pad 2, and pushes the wafer 4 to the polishing pad 2. In this manner, the lower surface of the wafer 4 is polished by the upper surface of the polishing pad 2. For example, the lower surface of the wafer 4 is a device forming surface.

The dresser 6 is used to perform a dressing the upper surface of the polishing pad 2 before and after polishing of the wafer 4. Accordingly, the performance of the polishing pad 2 can be improved and recovered. The control unit 7 controls various operations of the semiconductor fabricating device. For example, the control unit 7 controls the operations of the polishing table 1, the polishing head 3, the slurry supplying unit 5, and the dresser 6. Examples of the control unit 7 include a processor, an electric circuit, a computer, and so on.

Figure 2A:
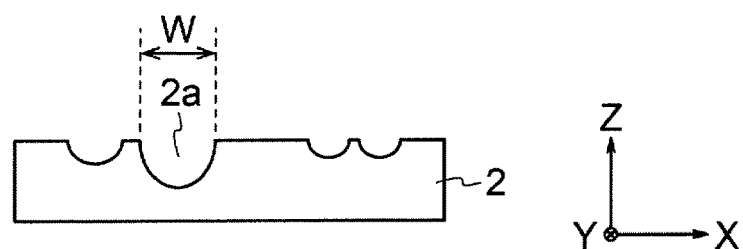
FIGS. 2A and 2B are a sectional view and a top view illustrating a structure of a polishing pad of the first embodiment.
Figure 2B:
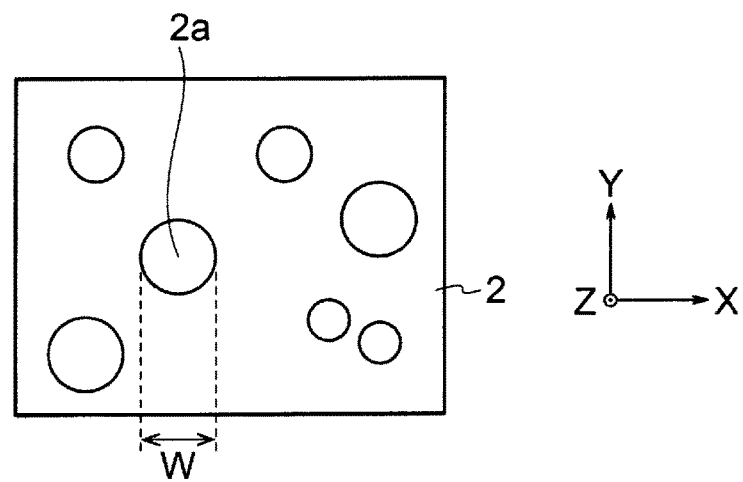

FIGS. 2A and 2B are a sectional view and a top view illustrating a structure of the polishing pad 2 of the first embodiment. FIG. 2A is a sectional view illustrating the cross section near the upper surface of the polishing pad 2. FIG. 2B is a top view illustrating the upper surface of the polishing pad 2 when viewed from above.

In this embodiment, a number of pores 2a are formed inside the polishing pad 2 or in the surface thereof. The pores 2a inside the polishing pad 2 are formed in spherical shape, for example. For this reason, the pore 2a of the surface of the polishing pad 2 are formed in the shape (for example, a hemispherical shape) in which a sphere is cut.

FIGS. 2A and 2B illustrate plural pores 2a formed in the upper surface of the polishing pad 2. These pores 2a are an example of recess portions. The wafer 4 is polished by the upper surface of the polishing pad 2. As illustrated in FIG. 2B, the shape of the pores 2a in the upper surface of the polishing pad 2 is a circular shape. A reference numeral W means a width of the pore 2a in the direction parallel to the upper surface of the polishing pad 2. The flat surface shape of the pores 2a of this embodiment is a circular shape, and thus the width W of the pores 2a becomes a diameter of a circle which is the flat surface shape of the pores 2a.

The polishing pad 2 of this embodiment is formed of a polyurethane foam, and the pore 2a is formed by using a balloon or a foaming agent, for example. However, the polishing pad 2 may be formed of another material, and plural recess portions other than the pores 2a may be formed in the upper surface thereof. Such recess portions may be formed by using dry etching, wet etching, cutting, a wire discharge, a laser, and a die, for example. In this case, the recess portions may not be formed inside the polishing pad 2, and may be formed only in the upper surface of the polishing pad 2.

In addition, the flat surface shape of the recess portions may be a shape other than the circular shape, or may be an elliptic shape or a polygonal shape, for example. In a case where the shape of the pores 2a inside the polishing pad 2 is a distorted spherical shape, the flat surface shape of the pores 2a of the surface of the polishing pad 2 is an elliptic shape. In addition, an example of a polygonal shape includes a triangle or a quadrangle which is a cross-section shape or a surface shape of a trigonal pyramid, a quadrangular pyramid, a hexahedron, an octahedron, a polyhedron, and the like.

In this embodiment, the width W of the pores 2a indicates a maximum dimension of the pores 2a in a direction parallel to the upper surface of the polishing pad 2. For example, in a case where the flat surface shape of the pore 2a is an elliptic shape, the width W of the pore 2a corresponds to a length of a long diameter of the elliptic shape. In addition, in a case where the flat surface shape of the pore 2a is a rectangular shape, the width W of the pore 2a corresponds to a length of a long side of the rectangular shape.

In this application the density of the pores 2A means the average density of the pores 2A at one area of the upper surface of the polishing pad 2. In this embodiment, the width W of the pores 2a in the upper surface of the polishing pad 2 is 20 μm or less, and the polishing pad 2 is formed or processed such that the density of the pores 2a in the upper surface of the polishing pad 2 is 1,300/mm² or more. For example, the width W of the pores 2a is set to be 1 to 20 μm, and the density of the pores 2a is set to be 1,300 to 400,000/mm².

Herein, the density of the pores 2a in the upper surface of the polishing pad 2 indicates the number of the pores 2a per unit area of the upper surface of the polishing pad 2. In addition, the description that the width W of the pores 2a in the upper surface of the polishing pad 2 is 20 μm or less means that the peak of the distribution showing a relation between the width W and the number of the pores 2a of the upper surface of the polishing pad 2 is within a range of 20 μm or less. That means that an average value of the width W of the pores 2a at one area of the upper surface of the polishing pad 2 is 20 μm or less in many cases. Similarly, the description that the width W of the pores 2a of the upper surface of the polishing pad 2 is 1 to 20 μm means that the peak of the distribution showing the relation between the width W and the number of the pores 2a of the upper surface of the polishing pad 2 is within a range of 1 to 20 μm. The same is applied to the recess portions other than the pores 2a.

FIGS. 3 to 5 are graphs for explaining the performance of the polishing pad 2 of the first embodiment.

FIG. 3 illustrates an experimental result of a case where the wafer 4 is polished by the polishing pad 2 by using a polishing slurry of a silicon oxide film. A polishing target in this case is the silicon oxide film provided in the wafer 4. The vertical axis of FIG. 3 indicates a removal rate (polishing rate) of the silicon oxide film.

FIGS. 4 and 5 illustrate experimental results of a case where the wafer 4 is polished by the polishing pad 2 by using a polishing slurry of a tungsten layer. A polishing target in this case is the tungsten layer provided in the wafer 4. The vertical axis of FIGS. 4 and 5 indicates a removal rate of the tungsten layer. Incidentally, the slurries having different average particle diameters are used in the experiments of FIGS. 4 and 5.

In FIG. 3, the first to third experiments are performed. In the first experiment, the polishing pad 2 is used in which the width W of the pores 2a in the upper surface of the polishing pad 2 is 20 to 40 μm, and the density of the pores 2a in the upper surface of the polishing pad 2 is 400 to 600/mm². In the second experiment, the polishing pad 2 is used in which the width W of the pores 2a in the upper surface of the polishing pad 2 is 5 to 20 μm, and the density of the pores 2a in the upper surface of the polishing pad 2 is 1,100 to 1,300/mm². In the third experiment, the polishing pad 2 is used in which the width W of the pores 2a in the upper surface of the polishing pad 2 is 5 to 10 μm, and the density of the pores 2a in the upper surface of the polishing pad 2 is 1,300/mm² or more (more specifically, 1,500/mm² or more). The same is applied to FIG. 4 or FIG. 5.

According to FIGS. 3 to 5, it is found that even when the kind of the slurry is changed, the removal rate is improved as the width W of the pores 2a becomes smaller, and the density of the pores 2a increases. The reason is that when the width W of the pores 2a is smaller, and the density of the pores 2a increases, the slurry can be efficiently supplied between the polishing pad 2 and the wafer 4.

Specifically, while not limiting the possible cause, the followings are considered as a possible cause. For example, when the width W of the pores 2a is larger, the slurry enters the pores 2a, and thus the slurry hardly contributes to the polishing. As a result, the polishing rate is reduced. In addition, when the density of the pores 2a decreases (that is, the number of the pores 2a is small), a space which allows the slurry to be contained in a gap between the polishing pad 2 and the wafer 4 becomes small, the slurry easily comes out from the gap. As a result, the slurry coming out from the gap does not contribute to the polishing, and thus the polishing rate is reduced. Therefore, the polishing pad 2 desirably has small pores 2a with a high density.

In these experiments, wettability (contact angle) of the slurry in the polishing pad 2 is measured. The measurement results are 67 degrees in the first experiment, 70 degrees in the second experiment, and 40 degrees in the third experiment. From results, it is found that compared to the other two polishing pads 2 of the first and second experiments, the polishing pad 2 of the third experiment in which the width W of the pores 2a is 5 to 10 μm, and the density of the pores 2a is 1,300/mm² or more has excellent wettability and is suitable for the polishing. When the wettability is excellent (the contact angle is small), the retention of the slurry is improved, and the polishing rate is increased.

Figure 6:
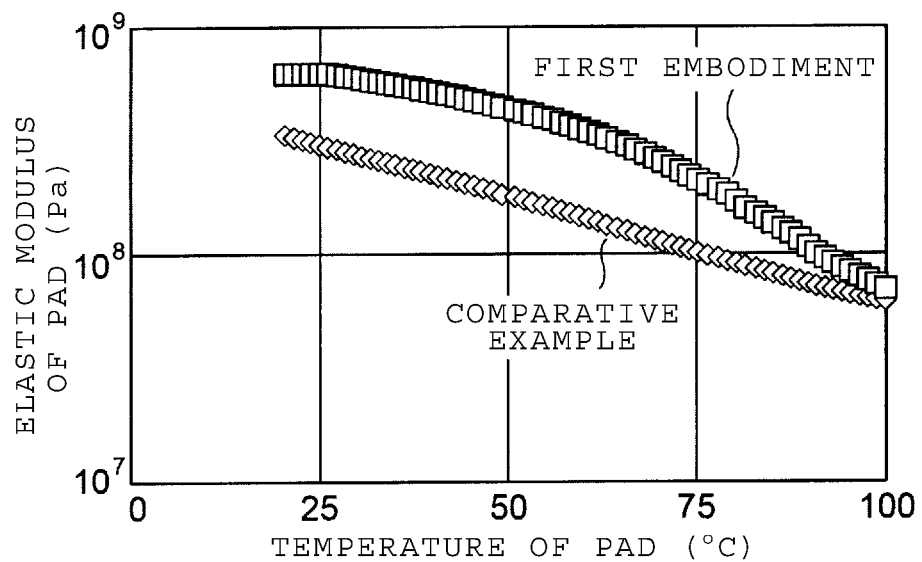
FIG. 6 is a graph in which the performance of the polishing pad is compared between the first embodiment and a comparative example thereof.

FIG. 6 is a graph in which the performance of the polishing pad 2 is compared between the first embodiment and a comparative example thereof.

The horizontal axis of FIG. 6 indicates a temperature of the upper surface of the polishing pad 2. The vertical axis of FIG. 6 indicates the elastic modulus of the polishing pad 2. In the upper surface of the polishing pad 2 of this embodiment, the width W of the pores 2a is 5 to 10 μm, and the density of the pores 2a is 1,300/mm² or more. On the other hand, in the upper surface of the polishing pad 2 of the comparative example, the width W of the pores 2a is 20 μm or more, and the density of the pores 2a is 1,300/mm² or less.

According to FIG. 6, the elastic modulus of the polishing pad 2 of this embodiment is higher than the elastic modulus of the polishing pad 2 of the comparative example under the same temperature. The elastic modulus of the polishing pad 2 of this embodiment is desirably $4.0 \times 10^8$ Pa or more at 30° C. and $2.0 \times 10^8$ Pa or more at 60° C. In FIG. 6, the elastic modulus of the polishing pad 2 of this embodiment is about $5.0 \times 10^8$ Pa at 30° C. and about $2.5 \times 10^8$ Pa at 60° C. Furthermore, the polishing pad 2 of this embodiment desirably has Shore hardness of 50 to 65.

Herein, generally, the hardness of the polishing pad 2 is reduced as the width W of the pores 2a becomes larger, and is increased as the width W of the pores 2a becomes smaller. In order to improve the performance of the polishing pad 2, desirably, the elastic modulus of the polishing pad 2 is increased, and the hardness of the polishing pad 2 is increased. Therefore, desirably, the elastic modulus of the polishing pad 2 of this embodiment is $4.0 \times 10^8$ Pa or more at 30° C., and is $2.0 \times 10^8$ Pa or more at 60° C.

However, when the hardness of the polishing pad 2 is increased, a scratch may easily occur in the wafer 4, which is problematic. Therefore, desirably, the hardness of the polishing pad 2 has an upper limitation. For this reason, desirably, the polishing pad 2 of this embodiment has Shore hardness of 50 to 65.

As described above, in the upper surface of the polishing pad 2 of this embodiment, the width W of the pores 2a is 5 to 10 μm, and the density of the pores 2a is 1,300/mm² or more. Therefore, according to this embodiment, it is possible to improve the polishing rate of the wafer 4, and it is possible to polish the wafer 4 efficiently.

Furthermore, as described above, the width W of the pores 2a is desirably set to be 1 to 20 μm, and the density of the pores 2a is desirably set to be 1,300 to 400,000/mm². Recently, the particle diameter of the slurry is less than 10 nm in some cases. In these cases, when the width W of the pores 2a is set to be less than 1 μm, the slurry particles may be aggregated in the pore 2a. In addition, in a case where the width W of the pores 2a is 1 μm, when the density of the pores 2a is more than 400,000/mm², the ratio of the volume of the pores 2a to the volume of the polishing pad 2 is 30% or more, and thus the hardness of the polishing pad 2 (for example, polyurethane) may become insufficient. Therefore, the width W or the density of the pores 2a is desirably set as above.

Second Embodiment

Figure 7:
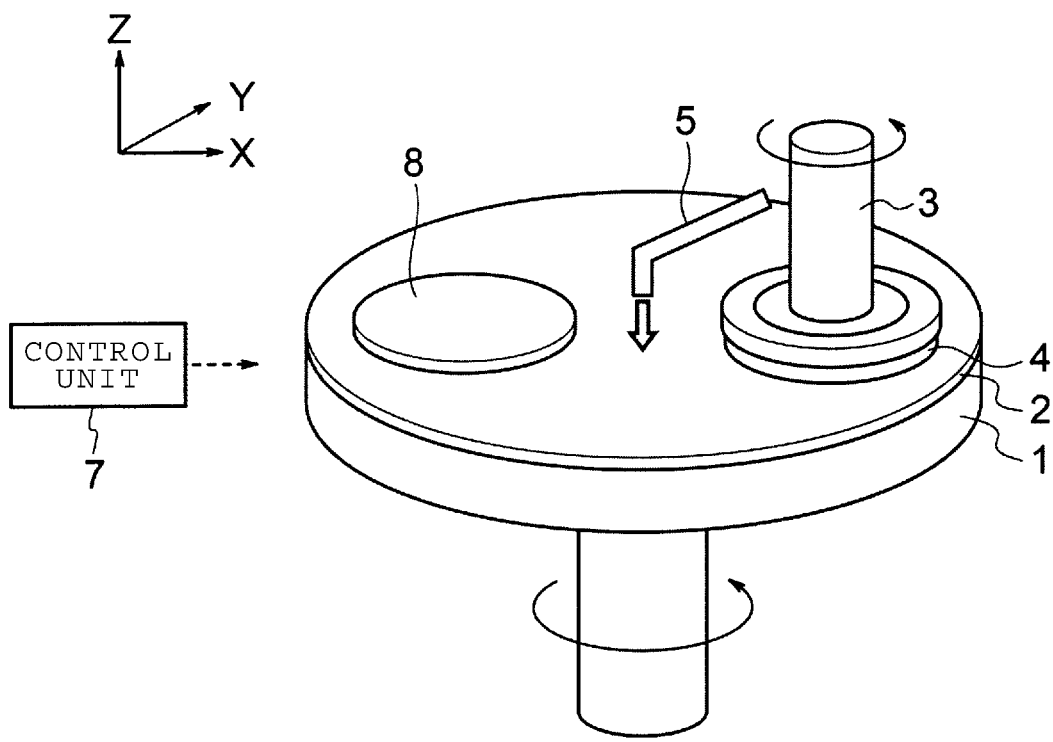
FIG. 7 is a perspective view illustrating a structure of a semiconductor fabricating device of a second embodiment.

FIG. 7 is a perspective view illustrating a structure of a semiconductor fabricating device of a second embodiment.

The semiconductor fabricating device of FIG. 7 includes a heat exchanger 8 in addition to the components illustrated in FIG. 1. Under the control of the control unit 7, the heat exchanger 8 can adjust the temperature of the upper surface of the polishing pad 2 by heat exchanging. For example, the control unit 7 monitors the temperature of the upper surface of the polishing pad 2 by a signal sent from a radiation thermometer (not illustrated) and adjusts the temperature of the upper surface of the polishing pad 2 by controlling the operation of the heat exchanger 8 based on the temperature measured by the radiation thermometer. The control unit 7 and the heat exchanger 8 are examples of a temperature adjusting unit. The heat exchanger 8 can perform both heating and cooling for example.

As described above, the elastic modulus of the polishing pad 2 is changed by the temperature (FIG. 6), and thus the polishing rate is changed by the temperature. According to this embodiment, a desirable polishing rate can be achieved by adjusting the temperature of the polishing pad 2 by using the control unit 7 and the heat exchanger 8.

FIG. 8 is a graph in which the performance of the polishing pad 2 is compared between the first and second embodiments.

The horizontal axis of FIG. 8 indicates a time, and the vertical axis of FIG. 8 indicates the temperature of the upper surface of the polishing pad 2. FIG. 8 illustrates change over time of the temperature of the polishing pad 2 of the first and second embodiments during the polishing of the wafer 4.

In FIG. 8, the polishing pad 2 of the second embodiment is formed of the same material as that of the first embodiment, and has the pores 2a which has the same width W and density as those of the polishing pad 2 of the first embodiment. However, the temperature of the polishing pad 2 of the second embodiment is adjusted by the heat exchanger 8 during the polishing while the temperature of the polishing pad 2 of the first embodiment is not adjusted by the heat exchanger 8 during the polishing. Incidentally, the temperature change of the polishing pad 2 of the first embodiment in FIG. 8 results from Joule heat generated in accordance with the polishing.

FIG. 8 illustrates a process that oxidizes a portion of the tungsten layer provided in the wafer 4 by the hydrogen peroxide to form a tungsten oxide film and polishes the tungsten oxide film in both the first and second embodiments. A chemical reaction that oxidizes the tungsten layer by the hydrogen peroxide is promoted as the temperature is higher. In addition, the tungsten oxide film has a property that is vulnerable compared to the tungsten layer so as to be easily polished. Therefore, when the polishing pad 2 is heated, the chemical reaction is promoted to increase the polishing rate. In a first step of FIG. 8, the polishing pad 2 of the first embodiment is heated by the heat exchanger 8. The temperature of the polishing pad 2 during the first step is an example of the first temperature.

On the other hand, in a case where the polishing pad 2 is formed of polyurethane, for example, when the temperature of the polishing pad 2 is increased, the elastic modulus of the polishing pad 2 is reduced (see FIG. 6). Therefore, in a case where the temperature of the polishing pad 2 is high, there is a concern that the flatness of the surface of the wafer 4 after ending the polishing is deteriorated. In this regard, in a second step after the first step of FIG. 8, the polishing pad 2 of the first embodiment is cooled by the heat exchanger 8. As a result, the temperature of the polishing pad 2 is decreased, and the flatness of the surface of the wafer 4 is improved. The temperature of the polishing pad 2 during the second step is an example of the second temperature.

Specifically, in the first step, the temperature of the polishing pad 2 is increased by supplying the hot water to the heat exchanger 8. On the other hand, in the second step, the temperature of the polishing pad 2 is decreased by supply a cold water or a normal temperature water to the heat exchanger 8. According to this embodiment, in the first step, the polishing rate of the wafer 4 can be improved caused by a high temperature, and in the second step, the flatness of the wafer 4 can be improved caused by a low temperature. That is, according to this embodiment, it is possible to improve the polishing rate and improve the flatness.

In FIG. 8, it should be noted that the polishing ending time of the second embodiment is earlier than the polishing ending time of the first embodiment. In the first embodiment, the temperature of the polishing pad 2 is increased gradually to be saturated near the time indicated by a dotted line in FIG. 8. On the other hand, in the second embodiment, the temperature of the polishing pad 2 can be adjusted to the high temperature immediately after starting the polishing. Additionally, in the second embodiment, the temperature of the polishing pad 2 can be decreased from the time indicated by the dotted line in FIG. 8, that is, the starting time of the second step.

Figure 9A:
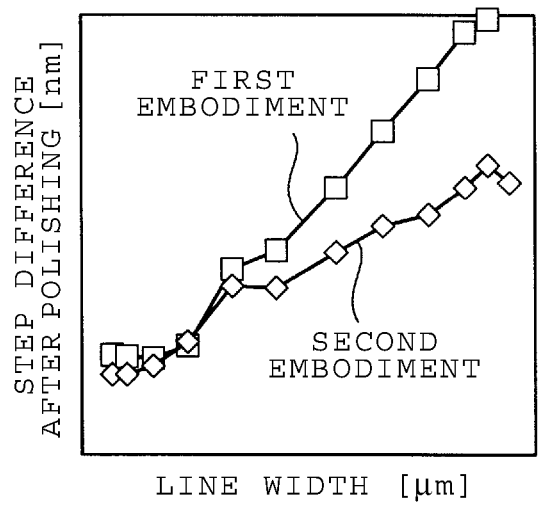
FIGS. 9A and 9B are graphs (2/2) in which the performance of the polishing pad is compared between the first and second embodiments.
Figure 9B:
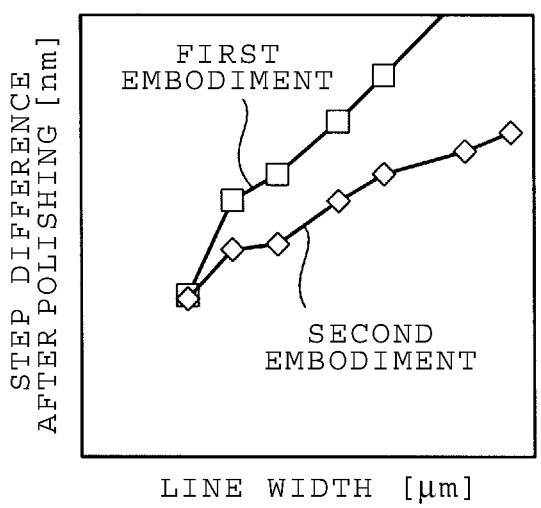

FIGS. 9A and 9B are other graphs in which the performance of the polishing pad 2 is compared between the first and second embodiments.

FIG. 9A shows a relation between a line width of the wiring pattern and a step remaining in the wafer 4 after ending the polishing in a case where the wiring pattern provided in the wafer 4 is polished by the method of FIG. 8. The same is applied to FIG. 9B. However, there is a difference in the ratio of the wiring pattern to the wafer 4. In FIG. 9A, the tungsten (W) making up the wiring pattern occupies 50% of the entire wafer, and in FIG. 9B, the tungsten (W) configuring the wiring pattern occupies 65% of the entire wafer. From those experimental results, it is found that according to the second embodiment, the step can be reduced, and the flatness of the wafer 4 can be improved compared to the first embodiment.

As described above, the semiconductor fabricating device of this embodiment adjusts the temperature of the upper surface of the polishing pad 2 by the heat exchanger 8. Therefore, according to this embodiment, it is possible to improve the polishing rate of the wafer 4 and improve the flatness of the wafer 4.

Third Embodiment

Figure 10A:
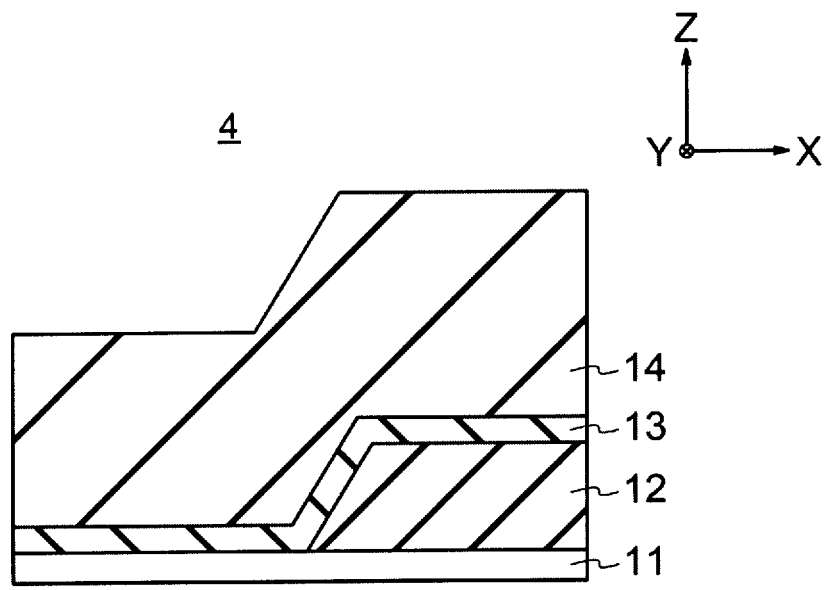
FIGS. 10A and 10B are sectional views illustrating a fabricating method of a semiconductor device of a third embodiment.
Figure 10B:
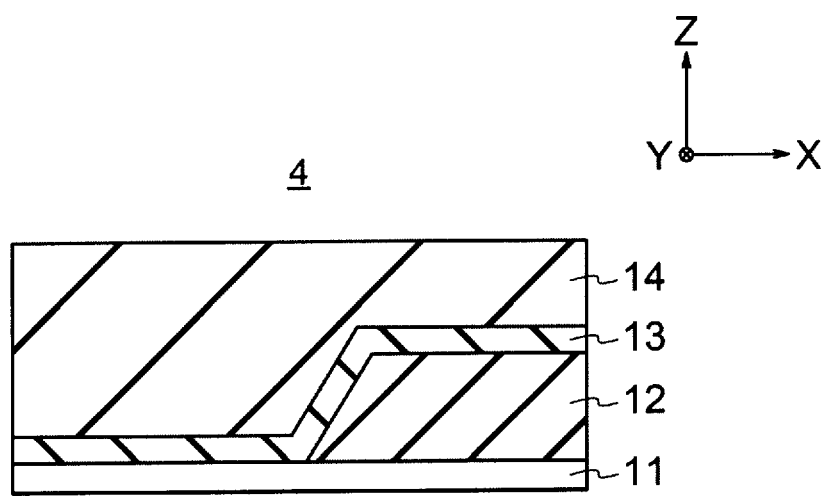

FIGS. 10A and 10B are sectional views illustrating a fabricating method of a semiconductor device of a third embodiment. In this embodiment, a semiconductor device such as a three-dimensional memory is manufactured from the above-described wafer 4.

First, as illustrated in FIG. 10A, a first insulation film 12, a second insulation film 13, and a third insulation film 14 are formed in order on a semiconductor substrate 11. The example of the semiconductor substrate 11 is a silicon substrate (silicon wafer). The example of the first insulation film 12 is a silicon oxide film. The example of the second insulation film 13 is a silicon nitride film. The example of the third insulation film 14 is a silicon oxide film.

Next, in order to flatten the surface of the third insulation film 14, the surface of the third insulation film 14 is polished by the semiconductor fabricating device of the first embodiment (FIG. 10B).

According to this embodiment, the third insulation film 14 such as a silicon insulation film can be polished efficiently by the above-described polishing pad 2. Incidentally, this embodiment may be applied to another layer in addition to the silicon oxide film.

Fourth Embodiment

Figure 11A:
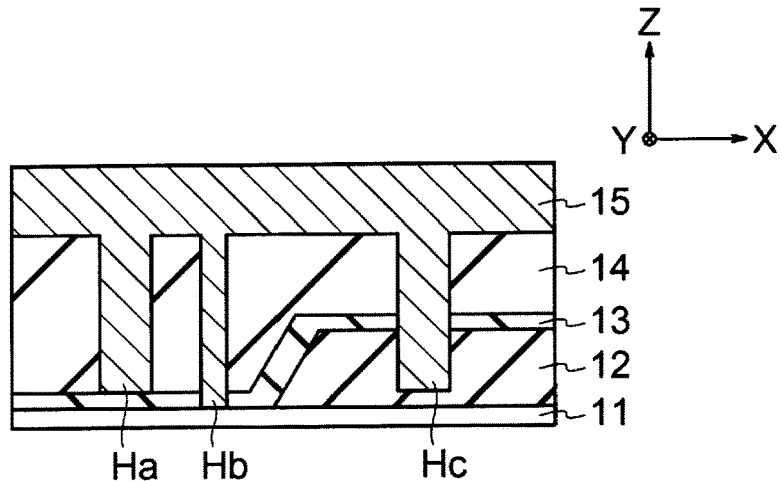
FIGS. 11A to 11C are sectional views illustrating a fabricating method of a semiconductor device of a fourth embodiment.
Figure 11B:
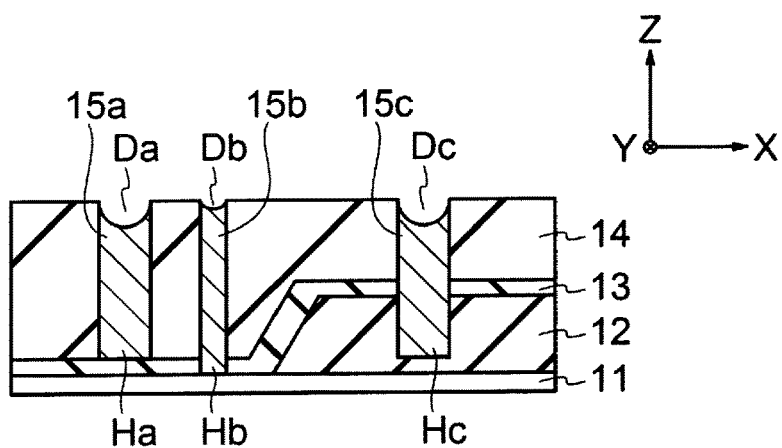
Figure 11C:
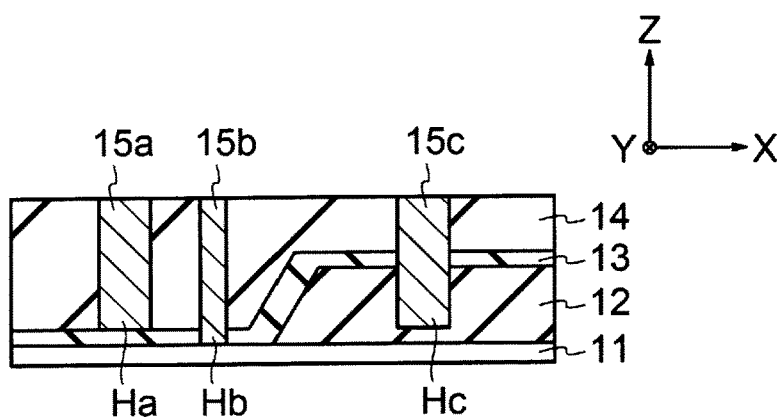

FIG. 11A to 11C are sectional views illustrating a fabricating method of a semiconductor device of a fourth embodiment.

First, after the process of FIG. 10B, holes Ha to Hc are formed in the first insulation film 12, the second insulation film 13, and the third insulation film 14 (FIG. 11A). Next, a plug member 15 is formed in the entire surface of the semiconductor substrate 11 (FIG. 11A). The example of the plug member 15 is a tungsten layer.

Next, the surface of the plug member 15 is polished in the first step of the second embodiment (FIG. 10B). Accordingly, the plug member 15 is polished during a short time, and plugs 15a to 15c are formed from the plug member 15 in the holes Ha to Hc. However, dishings Da to Dc are formed in the upper surface of the plugs 15a to 15c, so as to deteriorate the flatness of the upper surface of the plugs 15a to 15c.

Next, the upper surface of the plugs 15a to 15c and the upper surface of the third insulation film 14 are polished in the second step of the second embodiment (FIG. 11C). Accordingly, it is possible to improve the flatness of the upper surface of the plugs 15a to 15c. In addition, according to the second step of this process, it is possible to improve erosion occurring in the first step.

According to this embodiment, the plug member 15 such as the tungsten layer can be efficiently polished by the polishing pad 2 and the heat exchanger 8 described above. Incidentally, this embodiment may be applied to another layer in addition to the tungsten layer.

While certain embodiments have been described, these embodiments have been presented by way of example only, and are not intended to limit the scope of the inventions. Indeed, the novel pads, devices, and methods described herein may be embodied in a variety of other forms; furthermore, various omissions, substitutions and changes in the form of the pads, the devices, and the methods described herein may be made without departing from the spirit of the inventions. The accompanying claims and their equivalents are intended to cover such forms or modifications as would fall within the scope and spirit of the inventions.

What is claimed is:

1. A method of fabricating a semiconductor device, comprising:
    providing a polishing pad with a surface that has plural recess portions, wherein an average width of the recess portions at one area of the surface in a direction parallel to the surface is 20 μm or less, and an average density of the recess portions at one area of the surface is 1,300/mm$^2$ or more;
    after providing the polishing pad, holding the polishing pad on a pad polishing table;
    after holding the polishing pad, supplying a polishing liquid to the surface of the polishing pad;
    after supplying the polishing liquid, polishing a substrate using the polishing liquid in a gap between the polishing pad that includes the surface having the plural recess portions and the substrate; and
    after polishing the substrate, dressing an upper surface of the polishing pad that includes the surface having the plural recess portion using a dresser.

2. The method according to claim 1, wherein the average width of the recess portions at the one area of the surface in the direction parallel to the surface is 10 μm or more.

3. The method of claim 1, wherein the step of polishing comprising:
    a first step of polishing in which a surface temperature of the polishing pad is at a first temperature, and
    a second step of polishing in which the surface temperature of the polishing pad is changed to a second temperature different from the first temperature.

4. The method of claim 3, wherein the first step of polishing is performed at a higher polishing rate than the second step of polishing.

5. The method of claim 3, wherein the second step of polishing increases a flatness of the substrate compared to the first step of polishing.

6. The method of claim 1, wherein the polishing pad has an elastic modulus of $4.0 \times 10^8$ Pa or more at a temperature of 30° C., and an elastic modulus of $2.0 \times 10^8$ Pa or more at 60° C.

7. The method of claim 1, wherein the polishing pad has a Shore hardness of 50 or more and 65 or less.

8. A method of fabricating a semiconductor device, comprising:
   providing a polishing pad with a surface that has plural recess portions, wherein an average width of the recess portions at one area of the surface in a direction parallel to the surface is 20 μm or less, and an average density of the recess portions at one area of the surface is 1,300/mm² or more;
   after providing the polishing pad, dressing the surface of the polishing pad with a dresser;
   after dressing the surface of the polishing pad, holding the dressed polishing pad on a polishing table, wherein the dressed polishing pad includes the surface having the plural recess portions;
   after holding the dressed polishing pad, supplying a slurry to the surface of the dressed polishing pad; and
   after supplying the slurry, polishing a substrate with the slurry in a gap between the dressed polishing pad that includes the surface having the plural recess portions and the substrate.

9. The method of claim 8, further comprising:
   dressing the surface of the dressed polishing pad after the polishing the substrate.

10. The method of claim 8, wherein the recess portions in the surface have a circular shape, an elliptic shape, or a polygonal shape.

11. The method of claim 8, wherein the average width of the recess portions at the one area of the surface in the direction parallel to the surface is between 10 μm and 20 μm.

12. The method of claim 8, wherein the step of polishing comprising:
   a first step of polishing in which a surface temperature of the polishing pad is at a first temperature, and
   a second step of polishing in which the surface temperature of the polishing pad is changed to a second temperature different from the first temperature.

13. The method of claim 12, wherein the first temperature is higher than the second temperature.

14. The method of claim 12, wherein the first step of polishing is performed at a higher polishing rate than the second step of polishing.

15. The method of claim 12, wherein the second step of polishing increases a flatness of the substrate compared to the first step of polishing.

16. The method of claim 8, wherein the polishing pad has a Shore hardness of 50 or more and 65 or less.

* * * * *